United States Patent
Chan et al.

(10) Patent No.: US 6,709,930 B2
(45) Date of Patent: Mar. 23, 2004

(54) THICKER OXIDE FORMATION AT THE TRENCH BOTTOM BY SELECTIVE OXIDE DEPOSITION

(75) Inventors: Ben Chan, San Francisco, CA (US); Kam Hong Lui, Santa Clara, CA (US); Christiana Yue, Milpitas, CA (US); Ronald Wong, Millbrae, CA (US); David Chang, Saratoga, CA (US); Frederick P. Giles, San Jose, CA (US); Kyle Terrill, Santa Clara, CA (US); Mohamed N. Darwish, Campbell, CA (US); Deva Pattanayak, Cupertino, CA (US); Robert Q. Xu, Fremont, CA (US); Kuo-in Chen, Los Altos, CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 10/176,570

(22) Filed: Jun. 21, 2002

(65) Prior Publication Data

US 2003/0235958 A1 Dec. 25, 2003

(51) Int. Cl.[7] ................... H01L 21/336; H01L 21/3205
(52) U.S. Cl. ................. 438/270; 438/212; 438/268; 438/272; 438/589
(58) Field of Search ................. 438/212, 268, 438/270, 272, 431, 589

(56) References Cited

U.S. PATENT DOCUMENTS

| | | | | |
|---|---|---|---|---|
| 4,914,058 A | * | 4/1990 | Blanchard | 438/270 |
| 4,967,245 A | | 10/1990 | Cogan et al. | 357/23.4 |
| 4,992,390 A | | 2/1991 | Chang | |
| 5,082,795 A | * | 1/1992 | Temple | 438/138 |
| 5,183,774 A | * | 2/1993 | Satoh | 438/242 |
| 5,242,845 A | * | 9/1993 | Baba et al. | 438/243 |
| 5,372,950 A | | 12/1994 | Kim et al. | |
| 5,672,889 A | * | 9/1997 | Brown | 257/77 |
| 5,741,740 A | * | 4/1998 | Jang et al. | 438/435 |
| 5,770,878 A | * | 6/1998 | Beasom | 257/330 |
| 5,888,880 A | * | 3/1999 | Gardner et al. | 438/424 |
| 5,907,776 A | | 5/1999 | Hshieh et al. | 438/270 |
| 5,929,481 A | * | 7/1999 | Hshieh et al. | 257/328 |
| 6,063,694 A | | 5/2000 | Togo | 438/440 |
| 6,180,490 B1 | * | 1/2001 | Vassiliev et al. | 438/424 |
| 6,228,720 B1 | | 5/2001 | Kitabatake et al. | 438/268 |
| 6,300,219 B1 | * | 10/2001 | Doan et al. | 438/424 |
| 6,444,528 B1 | * | 9/2002 | Murphy | 438/270 |
| 6,445,035 B1 | * | 9/2002 | Zeng et al. | 257/329 |
| 6,455,378 B1 | | 9/2002 | Inagawa et al. | 438/270 |
| 6,534,365 B2 | | 3/2003 | Kim et al. | 438/270 |

OTHER PUBLICATIONS

Pending U.S. application Ser. No. 10/180,154, filing date: Jun. 25, 2003.

* cited by examiner

*Primary Examiner*—Matthew Smith
*Assistant Examiner*—Lex H. Malsawma
(74) *Attorney, Agent, or Firm*—Patent Law Group LLP; Rachel V. Leiterman

(57) ABSTRACT

A trench MOSFET is formed by creating a trench in a semiconductor substrate, then forming a barrier layer over a portion of the side wall of the trench. A thick insulating layer is deposited in the bottom of the trench. The barrier layer is selected such that the thick insulating layer deposits in the bottom of the trench at a faster rate than the thick insulating layer deposits on the barrier layer. Embodiments of the present invention avoid stress and reliability problems associated with thermal growth of insulating layers, and avoid problems with control of the shape and thickness of the thick insulating layer encountered when a thick insulating layer is deposited, then etched to the proper shape and thickness.

13 Claims, 5 Drawing Sheets

THICKER OXIDE FORMATION AT THE TRENCH BOTTOM BY SELECTIVE OXIDE DEPOSITION

BACKGROUND

Some metal-insulator-semiconductor (MIS) devices include a gate located in a trench that extends downward from the surface of a semiconductor substrate (e.g., silicon). The current flow in such devices is primarily vertical and, as a result, the cells can be more densely packed than devices with lateral current flow. All else being equal, this increases the current carrying capacity and reduces the on-resistance of the device. Devices included in the general category of MIS devices include metal-oxide-semiconductor field effect transistors (MOSFETs), insulated gate bipolar transistors (IGBTs), and MOS-gated thyristors.

Trench MOSFETs, for example, can be fabricated with a high transconductance ($g_{m,max}$) and low specific on resistance ($R_{on}$), which are important for optimal linear signal amplification and switching. One of the most important issues for high frequency operation, however, is reduction of the MOSFET internal capacitances. The internal capacitances include the gate-to-drain capacitance ($C_{gd}$), which is also called the feedback capacitance ($C_{rss}$), the input capacitance ($C_{iss}$), and the output capacitance ($C_{oss}$).

FIG. 1 is a cross-sectional view of a conventional n-type trench MOSFET 10. In MOSFET 10, an n-type epitaxial ("N-epi") layer 13, which is usually grown on an N+ substrate (not shown), is the drain. N-epi layer 13 may be a lightly doped layer, that is, an N− layer. A p-type body region 12 separates N-epi layer 13 from N+ source regions 11. Current flows vertically through a channel (denoted by the dashed lines) along the sidewall of a trench 19. The sidewall and bottom of trench 19 are lined with a thin gate insulator 15 (e.g., silicon dioxide). Trench 19 is filled with a conductive material, such as doped polysilicon, which forms gate 14. Trench 19, including gate 14 therein, is covered with an insulating layer 16, which may be borophosphosilicate glass (BPSG). Electrical contact to source regions 11 and body region 12 is made with a conductor 17, which is typically a metal or metal alloy. Gate 14 is contacted in the third dimension, outside of the plane of FIG. 1.

A significant disadvantage of MOSFET 10 is a large overlap region 18 formed between gate 14 and N-epi layer 13, which subjects a portion of thin gate insulator 15 to the drain operating voltage. The large overlap limits the drain voltage rating of MOSFET 10, presents long term reliability issues for thin gate insulator 15, and greatly increases the gate-to-drain capacitance, $C_{gd}$, of MOSFET 10. In a trench structure, $C_{gd}$ is larger than in conventional lateral devices, limiting the switching speed of MOSFET 10 and thus its use in high frequency applications.

SUMMARY

In accordance with the present invention, a trench MOSFET is formed by creating a trench in a semiconductor substrate. A barrier layer is formed over a portion of the side wall of the trench. A thick insulating layer is then deposited in the bottom of the trench. The barrier layer is selected such that the thick insulating layer material deposits in the bottom of the trench at a faster rate than it deposits on the barrier layer. In some embodiments, the barrier layer is silicon nitride formed by chemical vapor deposition or silicon dioxide grown thermally. In some embodiments, the thick insulating layer is silicon dioxide.

Embodiments of the present invention offer several advantages. The thick insulating layer at the bottom of the trench improves device performance by reducing the gate-to-drain capacitance. Selective deposition of the thick insulating layer avoids stress and reliability problems often associated with thermal growth of thick oxide layers in the bottom of the trench. Also, selective deposition avoids the problems with control of the shape and thickness of the thick insulating layer encountered when a thick insulating layer is deposited, then etched to the proper shape and thickness.

DETAILED DESCRIPTION

Figure 1:
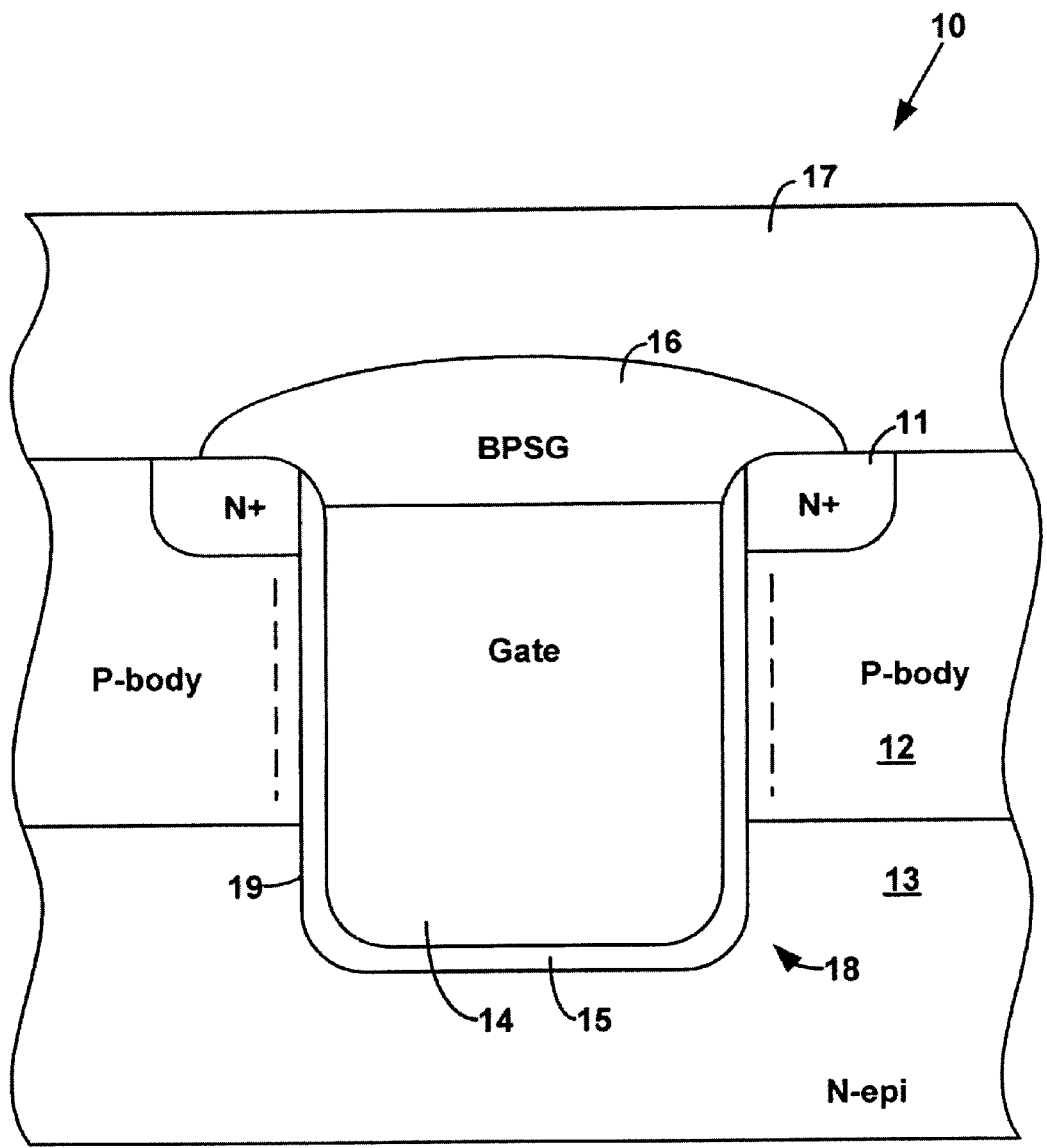
FIG. 1 is a cross sectional view of a conventional trench MOSFET.
Figure 2:
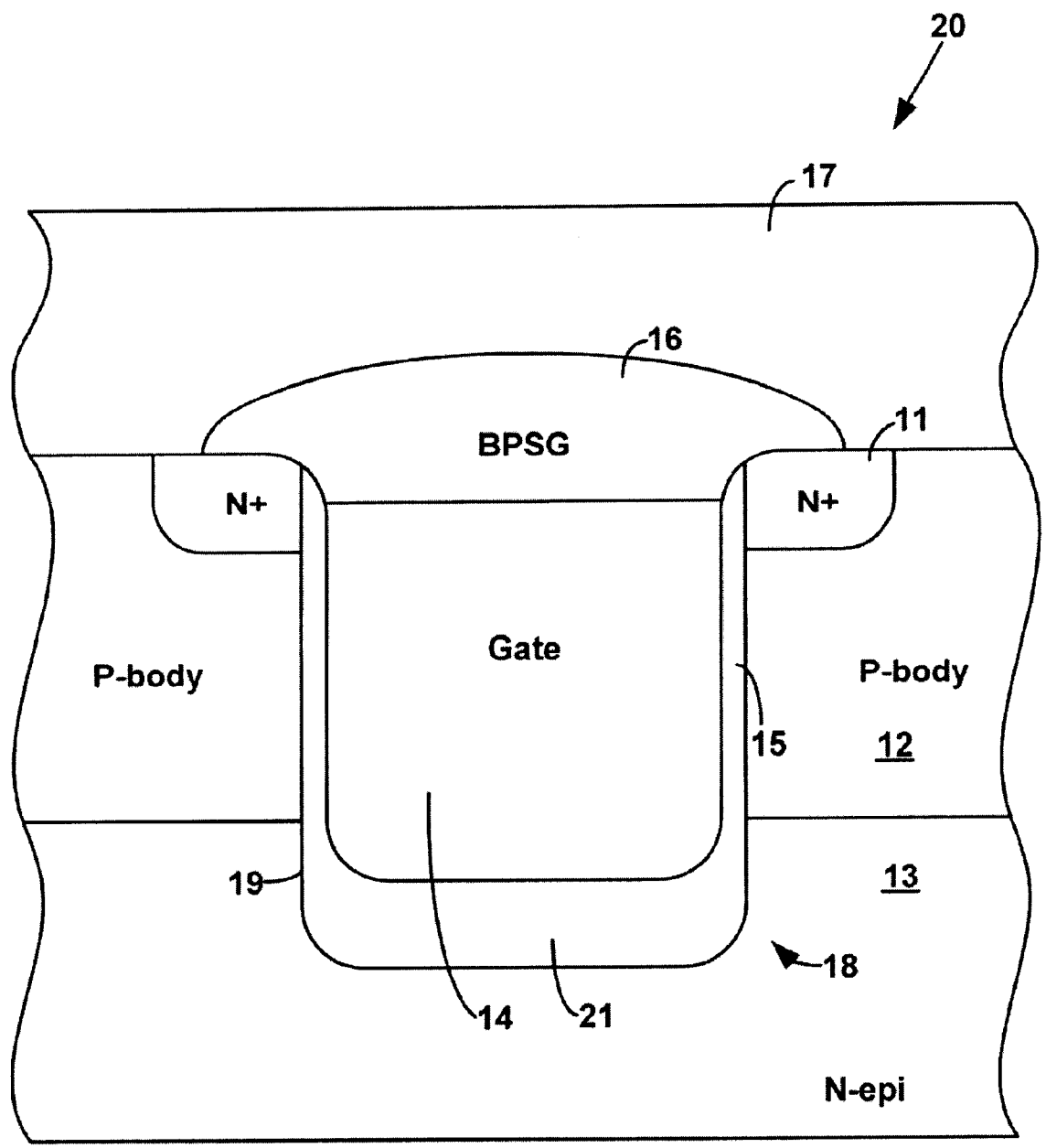
FIG. 2 is a cross sectional view of one embodiment of a trench MOSFET in accordance with the present invention.

FIG. 2 is a cross sectional view of one embodiment of a trench MOSFET 20 in accordance with the present invention. In MOSFET 20, an n-type epitaxial layer 13, which may be an N− layer and is usually grown on an N+ layer (not shown), forms the drain of the MOSFET. A p-type body layer 12 separates the N-epi layer 13 from N+ source regions 11. Body region 12 is diffused along the side wall of a trench 19. Polysilicon gate 14 is formed in trench 19. The side walls of trench 19 are lined with a thin gate insulator 15 (for example, silicon dioxide). A thick insulating layer 21 (for example, silicon dioxide) lines the bottom of trench 19 in MOSFET 20. Thick insulating layer 21 separates gate 14 from N-epi layer 13 (the drain). Thick insulating layer 21 provides a more effective insulator than is achievable with the thin insulating layer 15 lining the bottom of trench 19 in FIG. 1. Thus, thick insulating layer 21 minimizes the gate-to-drain capacitance and yields a trench MOSFET 20 useful for high frequency applications. The device shown in FIG. 2 is described in more detail in application Ser. No. 09/927,143, titled "Trench MIS Device With Active Trench Corners And Thick Bottom Oxide And Method Of Making The Same," filed on Aug. 10, 2001, which is incorporated herein by reference.

FIGS. 3A–3E are cross sectional views illustrated one embodiment of a process for fabricating the trench MOSFET illustrated in FIG. 2. A lightly-doped N-epi layer (typically about 8 μm thick) is grown on a heavily doped N+ substrate. A pad oxide 100 is grown on the N-epi layer, then a layer of silicon nitride 102 is deposited by, for example, low pressure chemical vapor deposition (LPCVD) on pad oxide 100. A trench mask, which may be photoresist, is deposited on nitride layer 102 and patterned to form an opening where the trench is to be located. A nitride etch is used to expose the trench opening, then a silicon etch is used to create the trench structure. The trench mask is then removed to leave the structure shown in FIG. 3A. Trench 19 formed in N-epi layer 13 may be about 0.5 to 1.2 μm wide and about 1 to 2 μm deep.

Figure 3A:
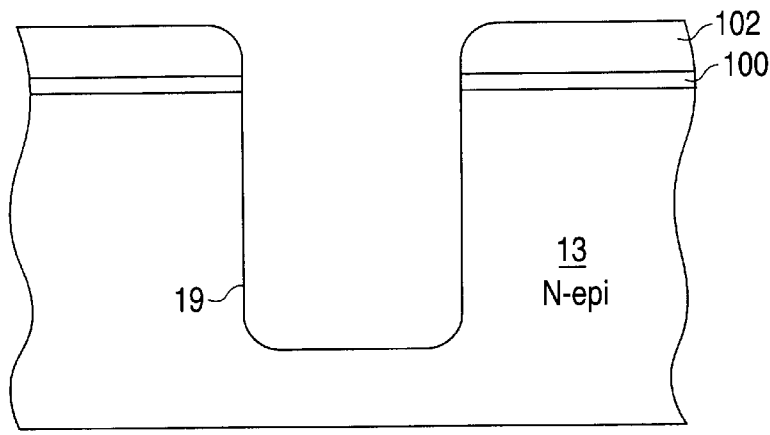
FIGS. 3A–3E are cross sectional views of embodiments of trench MOSFETs at various stages in fabrication.
Figure 3B:
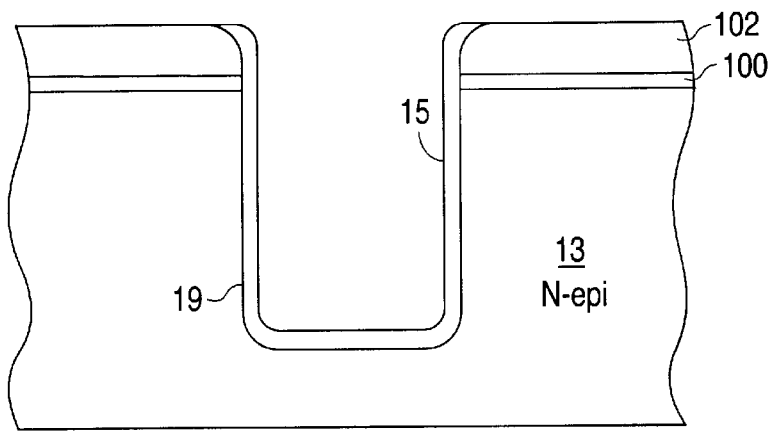
Figure 3C:
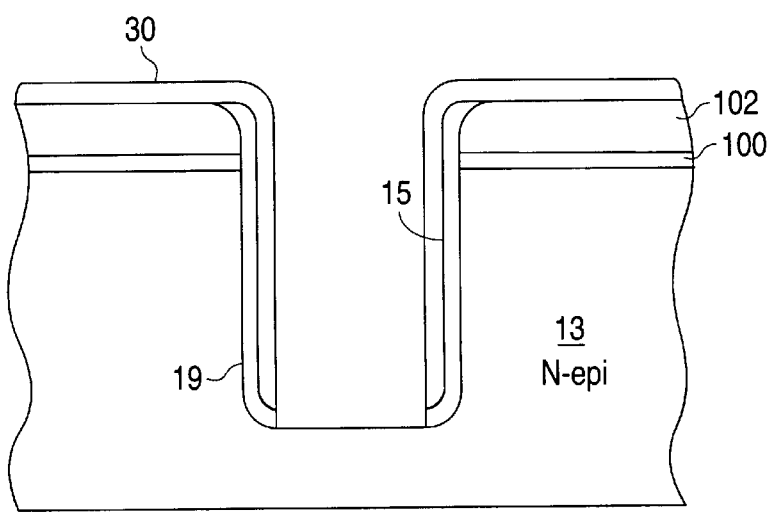

A thin gate insulator 15 is then formed in trench 19. Thin gate insulator 15 may be, for example, a silicon dioxide layer that is about 100 to 1000 angstroms thick. Such a layer may be thermally grown using a dry oxidation technique at 1050° C. for 20 minutes. The resulting structure is shown in FIG. 3B.

A barrier layer 30 is then deposited in trench 19 by, for example, LPCVD. The barrier may be, for example, silicon nitride ($Si_3N_4$). An anisotropic nitride etch is used to remove the barrier layer at the trench bottom. A buffered oxide etch is then used to etch away the thin gate insulator 15 in the bottom of trench 19, leaving the structure shown in FIG. 3C. Barrier layer 30 is selected such that during a subsequent oxide deposition step, the oxide preferentially deposits on the exposed silicon at the bottom of trench 19, rather than on barrier layer 30.

Figure 3D:
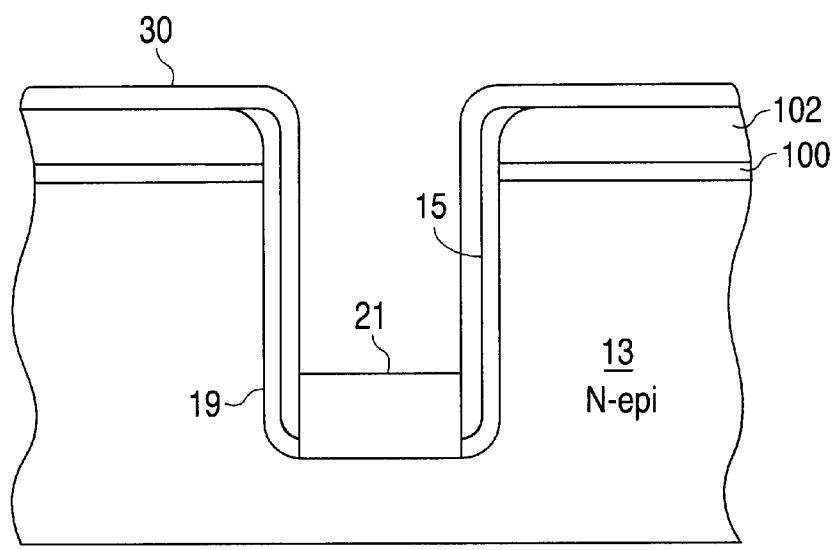
Figure 3E:
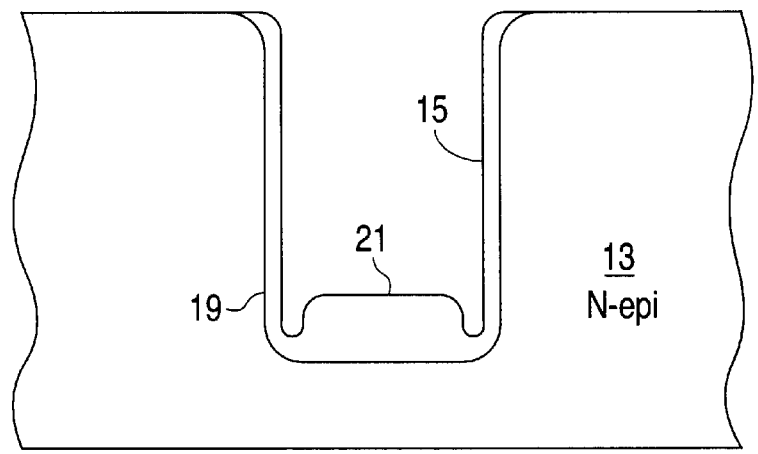

As shown in FIG. 3D, an oxide layer 21 is then selectively deposited on the silicon exposed in the bottom of trench 19 rather than on the barrier layer 30. Oxide 21 may be formed by, for example, subatmospheric chemical vapor deposition (SACVD) using ozone to drive the chemical reaction. During the reaction, ozone readily dissociates to release atomic oxygen, which combines with a precursor such as TEOS to form silicon dioxide. The structure may then be annealed. A buffered oxide etch is then used to remove the surface oxide, then a wet nitride etch is used to remove barrier layer 30, resulting in the structure shown in FIG. 3E.

Table 1 illustrates exemplary process parameters for ozone-activated TEOS SACVD formation of thick insulating layer 21.

TABLE 1

| | |
|---|---|
| Temperature | 400° C. |
| Pressure | 600 Torr |
| Ozone flowrate | 5000 sccm |
| Helium flowrate | 4000 sccm |
| TEOS flowrate | 325 mgm |
| GDP-to-wafer spacing | 250 mm |

As described above, the material used for barrier layer 30 is selected such that silicon dioxide preferentially deposits on silicon over barrier layer 30. The selection of the barrier layer material depends on the oxide deposition process used. Table 2 illustrates the deposition selectivity of several materials during ozone-activated TEOS SACVD.

TABLE 2

| Material | Deposition Selectivity |
|---|---|
| Si:Nitride | 5:1 |
| Si:Thermal Oxide | 3:1 |
| Si:TEOS PECVD Oxide | 2:1 |
| Si:$SiH_4$ PECVD Oxide | 1:1 |
| Si:PECVD BPSG | 1:1 |

As shown in Table 2, during ozone-activated TEOS SACVD, silicon dioxide deposits on silicon five times faster than it deposits on nitride layer. Thus, during fabrication of a device using nitride barrier layer 30 (FIG. 3D) to protect the side walls of trench 19, the silicon dioxide deposited in the bottom of trench 19 would be about five times thicker than any silicon dioxide deposited on the side walls of trench 19. In fact, for 3000 angstroms of oxide film growth on the a silicon surface, no oxide growth was observed on the nitride surface. The deposition selectivity is possibly due to the lower surface energy of silicon nitride compared to silicon. As illustrated in Table 2, thermally grown silicon dioxide or TEOS PECVD deposited silicon dioxide may also make a suitable barrier layer 30 when the deposition of layer 21 is ozone-activated TEOS SACVD, since silicon dioxide will also preferentially deposit on silicon over these materials. $SiH_4$ PECVD deposited silicon dioxide or PECVD deposited BPSG would not make suitable barrier layers for ozone-activated TEOS SACVD since silicon dioxide does not prefer silicon to these materials. If a deposition process besides ozone-activated TEOS SACVD is used, suitable materials for barrier layer 30 may differ from those shown in Table 2.

After oxide layer 21 is deposited, barrier layer 30 is removed by, for example, a dry etch followed by a wet etch, using etchants that have a high selectivity for barrier layer 30 over insulating layer 15. Once barrier layer 30 is removed, the structure shown in FIG. 3F remains. A thick insulating layer 21 is formed in the bottom of trench 19. The walls of trench 19 are protected by a thin insulating layer 15.

Returning now to FIG. 2, conductive material such as in-situ doped polysilicon or an undoped polysilicon that is subsequently implanted an annealed may then be deposited. The conductive material is etched, typically using a reactive ion etch, to form gate 14 (FIG. 2) such that the top of gate 14 is approximately level with the top of the semiconductor layers. In an n-type MOSFET, gate 14 may be, for example, a polysilicon layer with a doping concentration of $10^{20}$ $cm^{-3}$. Using known implantation and diffusion processes, p-type body regions 12 and N+ source regions 11 are formed in N-epi layer 13. The PN junctions between p-type body regions 12 and the remainder of N-epi layer 13 are usually located at a depth above the interface between thick insulating layer 21 and thin gate insulator 15.

Insulating layer 16, which may be, for example, BPSG, is deposited by CVD on the surface of the device. Insulating layer 16 is etched, typically using a dry etch, to expose portions of p-type body regions 12 and $N^+$ source regions 11. Electrical contact to body regions 12 and N+ source regions 11 is made by conductor 17, which is usually a metal or metal alloy deposited by, for example, physical vapor deposition, plating, sputtering, or evaporation. Electrical contact to the drain (not shown) is made to the opposite surface of the N+ substrate (not shown) on which N-epi layer 14 is grown.

Because the insulating layer 21 grown at the bottom of trench 19 favors the exposed bottom of trench 19 over the barrier-coated walls of trench 19, the above-described method is self-aligning, and avoids the use of an etch to control the shape and thickness of layer 21. The method described above thus allows incorporation of a thick insulating layer 21 at the bottom of trench 19 to minimize $C_{gd}$ with minimal undesirable effects or manufacturing concerns which may be caused by other methods such as thermal growth or other deposition techniques. For example, the above-described method avoids stress effects at the concave bottom of trench 19 and thinning of insulating layers at the junction of thick layer 21 with thin layer 15, both of which may be caused by thermal growth of thick layer 21. Also, the above-described method eliminates problems with control of thickness and shape of insulating layer 21, caused by etching to define the shape and thickness of thick layer 21. Such control problems may be encountered when thick layer 21 is deposited by PECVD, then etched to attain the desired shape and thickness of thick layer 21.

Figure 4:
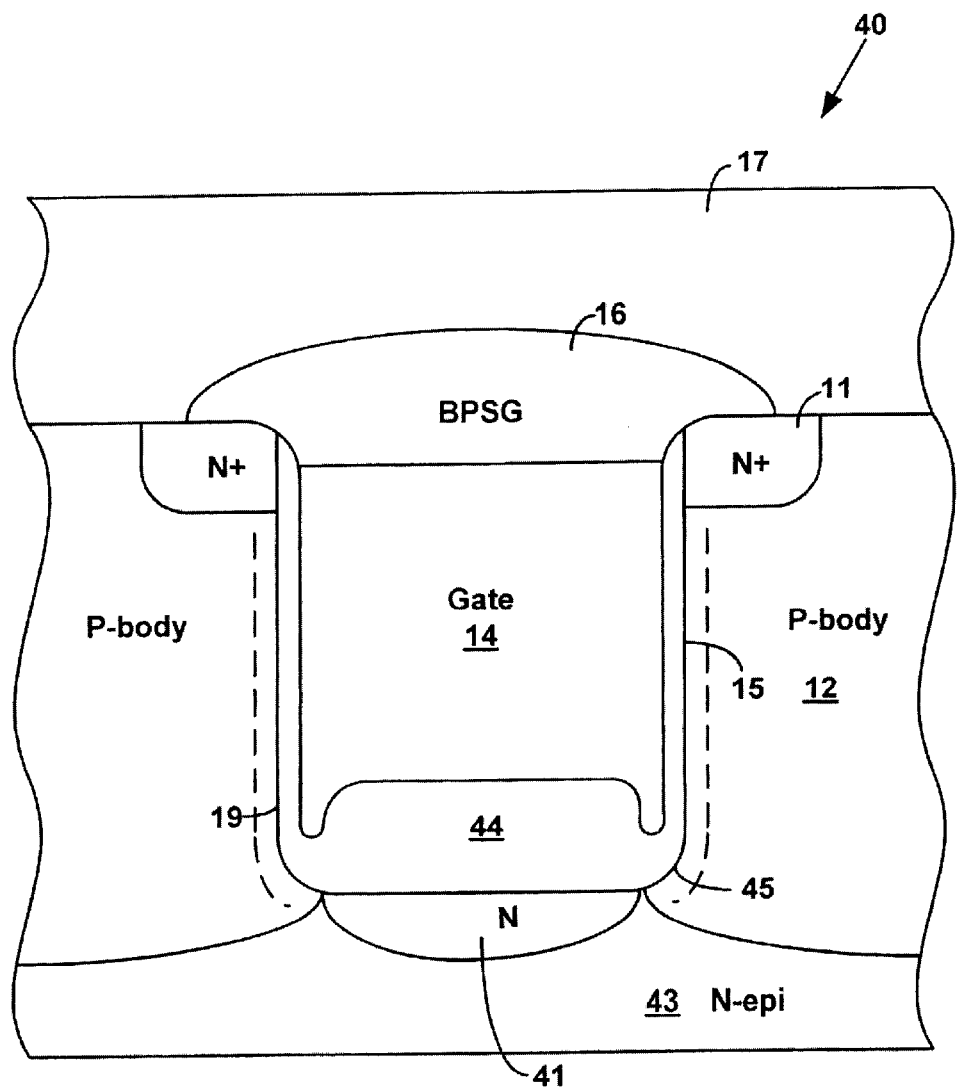
FIG. 4 is a cross sectional view of an alternative embodiment of a trench MOSFET in accordance with the present invention.

FIG. 4 is a cross sectional view of an alternative embodiment of a trench MOSFET 40 in accordance with the present invention. MOSFET 40 has an "active corner" configuration. Current flows vertically through a channel (denoted by dashed lines) along the sidewall and around corner region 45 of trench 19. A thick insulating layer 44 is located in the bottom of trench 19. MOSFET 40 may include an optional high conductivity region 41 at the bottom of trench 19 to help spread current more effectively. High conductivity region 41 may be created in N-epi layer 43 by implanting an n-type dopant, such as arsenic or phosphorous, through the bottom of trench 19 before insulating layer 44 is formed.

The trench MOSFET 40 of FIG. 4 uses thick layer 44 to separate gate 14 from N-epi layer 43, thereby decreasing the gate-to-drain capacitance, $C_{gd}$. Having the channel extend around corner region 45 to the bottom of the trench precludes significant gate-to-drain overlap in thin gate oxide regions because the diffusion of body region 12 can be very well controlled through corner region 45. Since lateral diffusion is six to ten times slower than vertical diffusion, the PN junction between body region 12 and N-epi layer 43 can be made to coincide with the transition between thin gate insulator 15 and thick insulating layer 44. Thus, thick layer 44 and active corner region 45 minimize the gate-to-drain capacitance, $C_{gd}$, with minimum impact on on-resistance, $R_{on}$, yielding a trench MOSFET 40 useful for high frequency applications.

The foregoing embodiments are intended to be illustrative and not limiting of the broad principles of this invention. Many additional embodiments will be apparent to persons skilled in the art. For example, the structures and methods of this invention can be used with any type of metal-insulator-semiconductor (MIS) device in which it is desirable to form an insulating layer between a trench gate and a region outside the trench, while minimizing the gate-to-drain overlap regions. Also, various insulative or conductive materials can be used where appropriate, and the invention is also applicable to p-type MOSFETs. The invention is limited only by the following claims.

We claim:

1. A method of fabricating a trench MOSFET, the method comprising:

providing a semiconductor substrate;

forming a trench in the substrate, the trench comprising a side wall and a bottom;

forming a thin insulating layer overlying the side wall and the bottom of the trench;

forming a barrier layer overlying the thin insulating layer on at least a portion of the side wall;

etching the thin insulating layer to form an exposed portion of the semiconductor substrate in the bottom of the trench; and depositing a thick insulating layer overlying the bottom of the trench;

wherein the barrier layer is selected such that the thick insulating layer deposits on the semiconductor substrate at a faster rate than the thick insulating layer deposits on the barrier layer.

2. The method of claim 1 wherein forming a barrier layer comprises forming a silicon nitride layer by chemical vapor deposition.

3. The method of claim 1 wherein forming a barrier layer comprises thermally growing a silicon dioxide layer.

4. The method of claim 1 wherein forming a barrier layer comprises depositing a layer of silicon dioxide by plasma-enhanced chemical vapor deposition using TEOS as a precursor.

5. The method of claim 1 wherein forming a barrier layer comprises:

depositing a conformal layer; and etching the conformal layer to form an opening in the conformal layer;

wherein the opening overlies a portion of the bottom of the trench.

6. The method of claim 1 wherein forming a barrier layer comprises:

depositing a conformal layer; and etching the conformal layer to form an opening in the conformal layer;

wherein the opening overlies the bottom of the trench and a portion of the side wall adjacent to the bottom of the trench.

7. The method of claim 1 wherein the thick insulating layer is silicon dioxide.

8. The method of claim 1 wherein depositing a thick insulating layer comprises depositing a thick insulating layer by sub atmospheric chemical vapor deposition.

9. The method of claim 8 wherein depositing a thick insulating layer by sub atmospheric chemical vapor deposition further comprises introducing ozone and TEOS into a reactor.

10. The method of claim 1 further comprising forming a high conductivity region in the substrate adjacent to a portion of the bottom of the trench.

11. The method of claim 1 further comprising:

forming a body region in the substrate, the body region being located adjacent to the side wall; and forming a source region in the body region, the source region being located adjacent to the side wall and to a top surface of the substrate.

12. The method of claim 1 further comprising depositing doped polysilicon in the trench.

13. The method of claim 1 wherein forming a thin insulating layer overlying the side wall and the bottom of the trench occurs prior to depositing a thick insulating layer overlying the bottom of the trench.

* * * * *